United States Patent [19]

Nagashima

[11] Patent Number: 6,080,648
[45] Date of Patent: Jun. 27, 2000

[54] METHOD OF FABRICATING SEMICONDUCTOR DEVICE

[75] Inventor: Naoki Nagashima, Tokyo, Japan

[73] Assignee: Sony Corporation, Tokyo, Japan

[21] Appl. No.: 09/104,431

[22] Filed: Jun. 25, 1998

[30] Foreign Application Priority Data

Jun. 26, 1997 [JP] Japan ................................. P09-169791

[51] Int. Cl.[7] ........................ H01L 21/44; H01L 21/4763
[52] U.S. Cl. ........................... 438/592; 438/682; 438/683
[58] Field of Search ................................... 438/592, 682, 438/683, 305

[56] References Cited

U.S. PATENT DOCUMENTS

| | | | |
|---|---|---|---|
| 5,840,609 | 11/1998 | Hyeon et al. | 438/299 |
| 5,946,573 | 8/1999 | Hsu | 438/275 |
| 5,966,597 | 10/1999 | Wright | 438/197 |

*Primary Examiner*—John F. Niebling
*Assistant Examiner*—Alexander G. Ghyka
*Attorney, Agent, or Firm*—Ronald P. Kananen; Rader, Fishman & Grauer

[57] ABSTRACT

Disclosed is a method of fabricating a semiconductor device, including the steps of: preparing a silicon substrate on which a gate insulating film and a gate electrode composed of a polycrystalline silicon film and an insulating film are sequentially formed; forming side walls from a material having an etching selectivity to the insulating film on both sides of the gate electrode; forming a resist film on the silicon substrate so as to cover the gate electrode, and etching-back the resist film until the resist film remains on the silicon substrate except for the gate electrode to expose an upper portion of the gate electrode; selectively removing the insulating film on the gate electrode using the resist film and the side walls as a mask, and removing the resist film; and forming a refractory metal film on the silicon substrate so as to cover the gate electrode, and forming metal silicide films on the gate electrode and the silicon substrate by silicidizing, through heat-treatment, the refractory metal film with the polycrystalline silicon film of the gate electrode and with the silicon substrate.

10 Claims, 10 Drawing Sheets

METHOD OF FABRICATING SEMICONDUCTOR DEVICE

BACKGROUND OF THE INVENTION

The present invention relates to a method of fabricating a semiconductor device, and particularly to a method of fabricating a semiconductor device composed of an insulated gate field effect transistor using a SALICIDE (Self-Aligned Silicidation) technology.

With the trend toward finer-geometries of a semiconductor integrated circuit, a gate length of an insulated gate field effect transistor has come to be shorter and thereby the resistance upon operation of the transistor has come to be lower. However, there is the tendency for the resistance of a contact portion to increase due to a reduction in diameter of the contact portion and for a parasitic resistance to increase due to shallow junction of a diffusion layer. As a result, the problem in terms of a reduction in current driving ability due to the increased parasitic resistance becomes increasingly serious. To reduce such a parasitic resistance, there has been proposed a SALICIDE technology in which a metal is deposited on a silicon based material, followed by heat-treatment to form a silicide of the metal, and the metal is removed with only the silicide left.

Figure 1A:
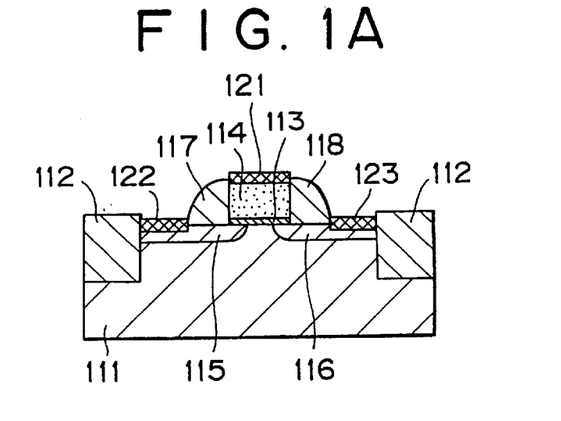
FIGS. 1A to 1C are process diagrams illustrating a related art fabrication method.

The SALICIDE technology will be briefly described below. As shown in FIG. 1A, a gate electrode 114 is formed on a silicon substrate 111 through a gate insulating film 113 in a region between isolation insulating films 112 formed in the silicon substrate 111, and diffusion electrodes 115 and 116 are formed in the silicon substrate 111 on both sides of the gate electrode 114. On both the sides of the gate electrode 114 are also formed side walls 117 and 118. Then, a cobalt film is deposited on the silicon substrate 111 having such a gate structure, followed by heat-treatment for silicidation of cobalt and removal of unreacted cobalt using dilute ammonia, to form a cobalt silicide electrode 121 on the gate electrode 114 and cobalt silicide electrodes 122 and 123 respectively on the diffusion electrodes 115 and 116. According to this method, the cobalt silicide electrode 121 formed on the gate electrode 114 is at the level higher than that of the side walls 117 and 118.

Figure 1B:
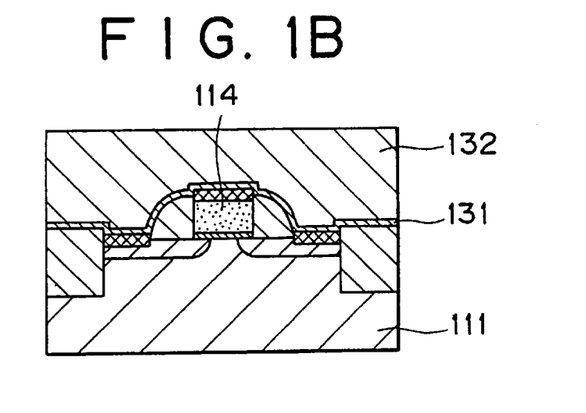
Figure 1C:
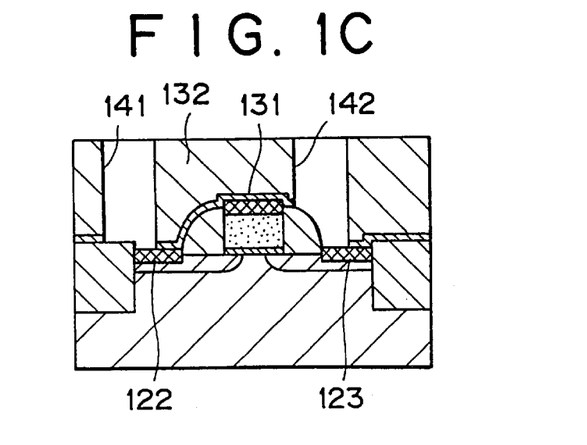

As shown in FIG. 1B, a silicon nitride film 131 is deposited on the silicon substrate 111 in such a manner as to cover the gate electrode 114 and the like, and a silicon oxide film 132 is deposited thereon. Then, as shown in FIG. 1C, contact holes 141 and 142 are opened in the silicon oxide film 132 by a lithography technique and an etching technique by means of which silicon oxide exhibits an etching selectivity to silicon nitride. Then, the silicon nitride film 131 is etched by an etching technique by means of which silicon nitride exhibits an etching selectivity to silicon oxide. In this way, the contact holes 141 and 142 respectively reaching to the cobalt silicide electrodes 122 and 123 are formed.

On the other hand, along with a trend toward finer-geometries of a semiconductor integrated circuit, it has come to be difficult to make larger a distance between a contact portion and a gate electrode, and to cope with such an inconvenience, there has been proposed a SAC (Self-Aligned Contact) technology in which a film formed of a material different from that of an interlayer insulating film is formed on an upper portion and side portions of a gate electrode for preventing a contact portion from being in contact with or close to the gate electrode.

In accordance with the related art SAC process, however, it has been required to deposit an insulating film on a gate electrode for ensuring insulation between a contact portion and the gate electrode before the gate electrode is processed. As a result, for silicidation of a gate electrode as well as source/drain electrodes (for example, a silicon substrate), an insulating film on the gate electrode must be removed before deposition of a metal for silicidation. In this regard, if an insulating film made from a material similar to that of an isolation insulating film is formed on a gate electrode, there occurs a problem that the isolation insulating film is etched upon removal of the insulating film on the gate electrode by etching.

The fabrication method described with reference to FIGS. 1A to 1C presents another problem. If a position of a contact hole is shifted to be overlapped to side walls formed on side walls of a gate electrode, a distance between the gate electrode (particularly, silicide portion) and a contact portion formed in the contact hole is made narrow, to thereby reduce a withstand voltage characteristic.

OBJECT AND SUMMARY OF THE INVENTION

An object of the present invention is to provide a method of fabricating a semiconductor device, which is capable of solving a problem that in the case of using the SALICIDE technology in combination with the SAC technology, an insulating film made from a material similar to that of an insulating film formed on a gate electrode is removed upon removal of the insulating film formed on the gate electrode, and a distance between a contact portion and a gate electrode is made narrow to thereby reduce a withstand voltage characteristic.

To achieve the above object, according to a first fabrication method of the present invention, there is provided a method of fabricating a semiconductor device, including the steps of: preparing a silicon substrate on which a gate insulating film is formed and a gate electrode composed of a multi-layer film of a polycrystalline silicon film and an insulating film is formed on the gate electrode; forming side walls from a material having an etching selectivity to the insulating film on both sides of the gate electrode; forming a resist film on the silicon substrate in such a manner as to cover the gate electrode, and etching-back the resist film until the resist film remains on the silicon substrate except for the gate electrode portion to expose an upper portion of the gate electrode; selectively removing the insulating film on the gate electrode using the resist film and the side walls as a mask, and removing the resist film; and forming a refractory metal film on the silicon substrate in such a manner as to cover the gate electrode, and forming metal slicide layer on the gate electrode and the silicon substrate by silicidizing, through heat-treatment, the refractory metal film with the polycrystalline silicon film of the gate electrode and with the silicon substrate.

According to the first fabrication method, after the resist film is etched-back in a state in which it remains on the silicon substrate except for the gate electrode portion, the insulating film on the gate electrode is removed. As a result, only the insulating film is selectively removed. In other words, any portion other than the insulating film, for example, the isolation insulating films formed on the silicon substrate are not etched.

According to the first fabrication method, the metal silicide layer is formed on the polycrystalline silicon film of the gate electrode after the insulating film on the polycrystalline silicon film is removed. That is to say, the metal silicide layer is formed in a state being lower than tops of the side walls. As a result, even if contact portions are formed in a state being overlapped to the side walls, it is possible to ensure distances between the gate electrode and the contact portions by the presence of the side walls.

According to a second fabrication method of the present invention, there is provided a method of fabricating a semiconductor device, including the steps of: preparing a silicon substrate on which a gate insulating film is formed and a gate electrode composed of a multi-layer film of a polycrystalline silicon film and an insulating film is formed on the gate insulating film; forming side walls from a material having an etching selectivity to the insulating film on both sides of the gate electrode; forming a mask layer from a material having an etching selectivity to the insulating film on the silicon substrate in such a manner as to cover the silicon substrate; selectively removing the insulating film on an upper portion of the gate electrode using the mask layer and the side walls as a mask, and removing the mask layer; and forming a refractory metal film on the silicon substrate in such a manner as to cover the gate electrode, and forming metal silicide layer on the gate electrode and the silicon substrate by silicidizing, through heat-treatment, the refractory metal film with the polycrystalline silicon film of the gate electrode and with the silicon substrate.

According to the second fabrication method, since the insulating film on the upper portion of the gate electrode is removed in a state in which the silicon substrate except for the gate electrode portion is covered with the mask layer and side walls which are made from the material having an etching selectivity to the insulating film. As a result, only the insulating film is selectively removed. In other words, any portion other than the insulating film, for example, the isolation insulating films formed on the silicon substrate, are not etched.

According to the first fabrication method, the metal silicide layer is formed on the polycrystalline silicon film of the gate electrode after the insulating film on the polycrystalline silicon film is removed. That is to say, the metal silicide layer is formed in a state being lower than tops of the side walls. As a result, even if contact portions are formed in a state being overlapped to the side walls, it is possible to ensure distances between the gate electrode and the contact portions by the presence of the side walls.

DETAILED DESCRIPTION OF PREFERRED EMBODIMENTS

Hereinafter, preferred embodiments of the present invention will be described with reference to the accompanying drawings.

A first embodiment concerning a first fabrication method of the present invention will be described with reference to fabrication steps shown in FIGS. 2A to 2I.

Figure 2A:
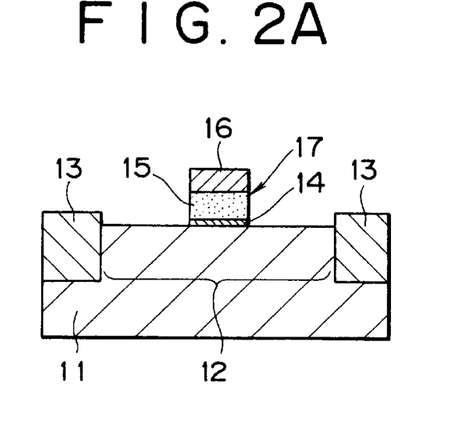
FIGS. 2A to 2I are process diagrams illustrating a first embodiment concerning a first fabrication method of the present invention.

As shown in FIG. 2A, isolation regions 13 for isolating an element forming region 12 from other regions are formed in a silicon substrate 11, followed by formation of, for example, a well in the silicon substrate 11 and implantation of ions of an impurity in the silicon substrate 11 for adjustment of a threshold voltage (Vth) or the like, and a gate insulating film 14 is formed on the silicon substrate 11 to a thickness of about 5 nm by an oxide film forming process such as thermal oxidation. A polycrystalline silicon film 15 is then formed to a thickness of about 200 nm by a film forming process such as CVD (Chemical Vapor Deposition) and an insulating film 16 made from silicon oxide doped with phosphorous (P) is formed thereon to a thickness of about 150 nm. The insulating film 16 and polycrystalline silicon film 15 are patterned by a lithography technique and an anisotropic etching technique, to form a gate electrode 17.

Figure 2B:
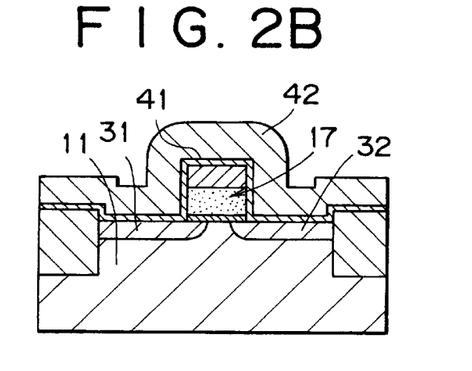

As shown in FIG. 2B, ions of an impurity are implanted in the silicon substrate 11 using the gate electrode 17 as a mask, to form extension electrodes 31 and 32 for source/drain electrodes. A silicon oxide film 41 is formed, for example, to a thickness of about 20 nm in such a manner as to cover the gate electrode 17 on the silicon substrate 11 and a silicon nitride film 42 is formed thereon, for example, to a thickness of 150 nm.

Figure 2C:
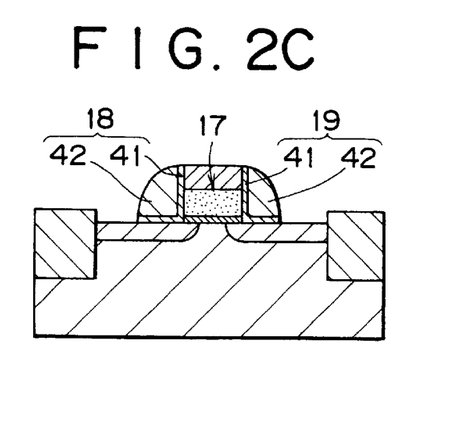

The silicon nitride film 42 and the silicon oxide film 41 are anisotropically etched in such a manner as to remain only on side walls of the gate electrode 17 as shown in FIG. 2C, to form side walls 18 and 19. The side walls 18 and 19, which have an etching selectivity to the insulating film 16, can be used as an etching mask at the following step for etching the insulating film 16.

Figure 2D:
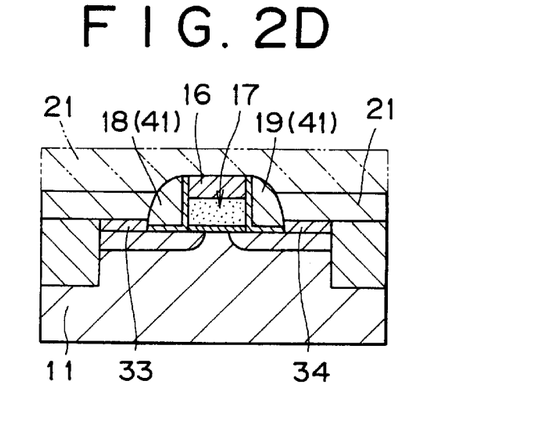

As shown in FIG. 2D, silicon layers 33 and 34 are selectively deposited by a selective epitaxial growth process on regions in which the silicon substrate 11 is exposed, and a resist film 21 is formed by a coating technique on the silicon substrate 11 to a thickness of about 500 nm in such a manner as to cover the gate electrode 17, the side walls 18 and 19, and the like. The resist film 21 is then removed to a thickness of about 300 nm (shown by a two-dot chain line in FIG. 4D) by anisotropic etching, to expose the insulating film 16 from the resist film 21.

Figure 2E:
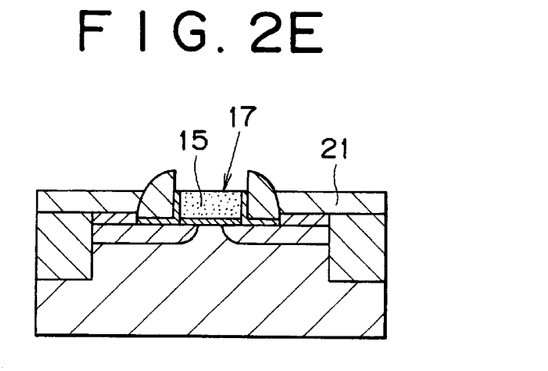

The insulating film 16 is anisotropically etched under such an etching condition that an etching rate of the insulating film 16 made from silicon oxide doped with phosphorous (P) becomes about 30 times that of the side walls 18 and 19 made from silicon nitride. For example, the etching is performed by a plasma etching system using an etching gas containing 18 sccm (standard cubic centimeters per minutes, cm$^3$/min in standard condition) of octafluorocyclobutane (c-$C_4F_8$), 300 sccm of carbon monoxide (CO) and 400 sccm of argon (Ar). In this case, a pressure in an etching atmosphere is set at 5.3 Pa and a RF power is set at 1.5 kW. The above etching is followed by wet etching (etching time: 60 sec) using a diluted solution of hydrofluoric acid (for example, water: hydrofluoric acid=100:1), to remove the insulating film 16 made from silicon oxide, whereby the polycrystalline silicon film 15 of the gate electrode 17 is exposed as shown in FIG. 2E.

Figure 2F:
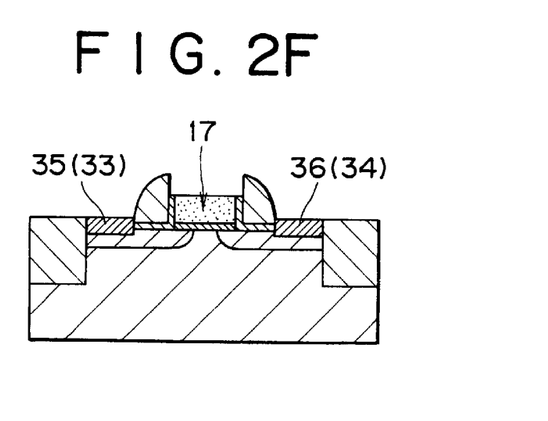

After the resist film 21 is removed as shown in FIG. 2F, ions of an impurity are implanted in the silicon layers 33 and 34 and the gate electrode 17 by an ion-implantation process, followed by RTA (Rapid Thermal Annealing), for example, lamp annealing at 1000° C. for 10 seconds, to form source/drain electrodes 35 and 36 in the silicon layers 33 and 34 respectively.

Figure 2G:
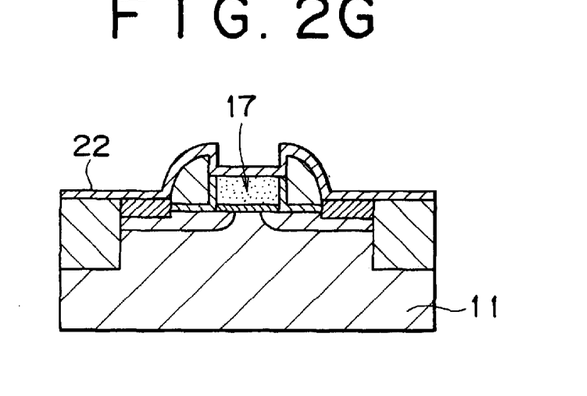

As shown in FIG. 2G, a refractory metal film 22 for forming a silicide, which is made from cobalt, is deposited to a thickness of 20 nm over the entire surface of the silicon substrate 11 on the gate electrode 17 side.

Figure 2H:
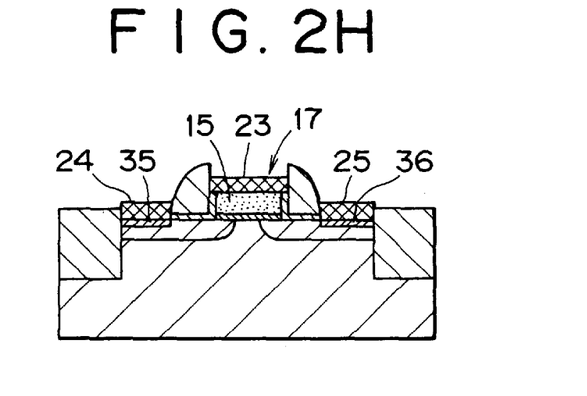

The refractory metal film 22 is then subjected to heat-treatment (for example, RTA) for silicidation of cobalt. Specifically, the heat-treatment is performed by lamp annealing at 550° C. for 30 seconds, for example. The unreacted refractory metal film 22 is removed by wet etching using dilute sulfuric acid, with a result that only a cobalt silicide layer remains. Thus, as shown in FIG. 2H, a metal silicide layer 23 made from cobalt silicide is formed on the polycrystalline silicon film 15 of the gate electrode 17, and metal silicide layers 24 and 25 made from cobalt silicide are respectively formed on the source/drain electrodes 35 and 36.

Figure 2I:
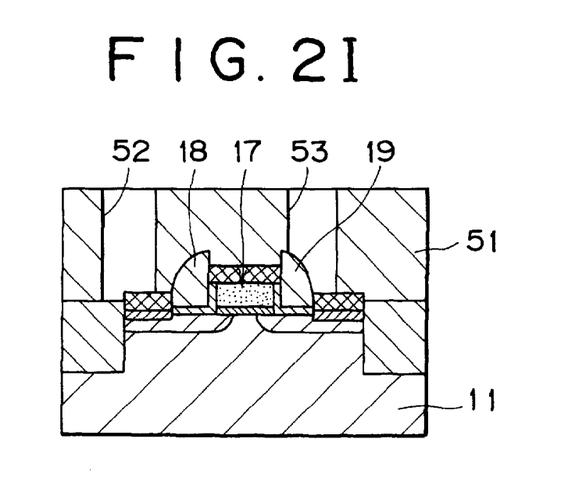

As shown in FIG. 2I, an interlayer insulating film 51 made from silicon oxide is deposited on the silicon substrate 11 in such a manner as to cover the gate electrode 17 and the like, and contact holes 52 and 53 are opened in the interlayer insulating film 51 by lithography and etching. Here, the contact holes 52 and 53 are formed by anisotropic etching under such a condition that an etching rate of the interlayer insulating film 51 made from silicon oxide becomes about 30 times that of the side walls 18 and 19 made from silicon nitride. For example, the etching is performed by a plasma etching system using an etching gas containing 18 sccm of octafluorocyclobutane (c-$C_4F_8$), 300 sccm of carbon monoxide (CO) and 400 sccm of argon (Ar). In this case, a pressure in an etching atmosphere is set at 5.3 Pa and a RF power is set at 1.5 kw. While not shown, a contact hole is also formed directly over the metal silicide layer 23.

In the fabrication method according to the above first embodiment, a resist film (not shown) formed by lithography is removed after etching using the resist pattern as a mask.

In accordance with the fabrication method according to the first embodiment, a CMOS transistor is formed as follows: namely, extension electrodes 31 and 32 and source/drain electrodes 35 and 36 of a PMOS transistor are formed by doping a p-type impurity in a region where the pMOS transistor is to be formed, covering a region where an nMOS transistor is to be formed with a resist mask; and extension electrodes 31 and 32 and source/drain electrodes 35 and 36 of the nMOS transistor are formed by doping an n-type impurity in the region where the nMOS transistor is to be formed, covering the region where the pMOS transistor is to be formed with a resist mask.

According to the first fabrication method, after the resist film 21 is etched-back in a state in which it remains on the silicon substrate 11 except for the gate electrode 17 portion, the insulating film 16 on the gate electrode 17 is removed. As a result, only the insulating film 16 is selectively removed. In other words, any portion other than the insulating film 16, for example, the isolation insulating films 13 formed on the silicon substrate 11, is not etched.

According to the first fabrication method, the metal silicide layer 23 is formed on the polycrystalline silicon film 15 of the gate electrode 17 after the insulating film 16 on the polycrystalline silicon film 15 is removed. That is to say, the metal silicide layer 23 is formed in a state being lower than tops of the side walls 18 and 19. As a result, even if the contact holes 52 and 53 are formed in a state being overlapped to the side walls 18 and 19, it is possible to ensure distances between the gate electrode 17 and contact portions (not shown) to be formed in the contact holes 52 and 53 by the presence of the side walls 18 and 19.

A second embodiment concerning a second fabrication method of the present invention will be described with reference to fabrication steps shown in FIGS. 3A to 3N. In these figures, parts corresponding to those shown in FIGS. 2A to 2I are indicated by the same reference numerals.

Figure 3A:
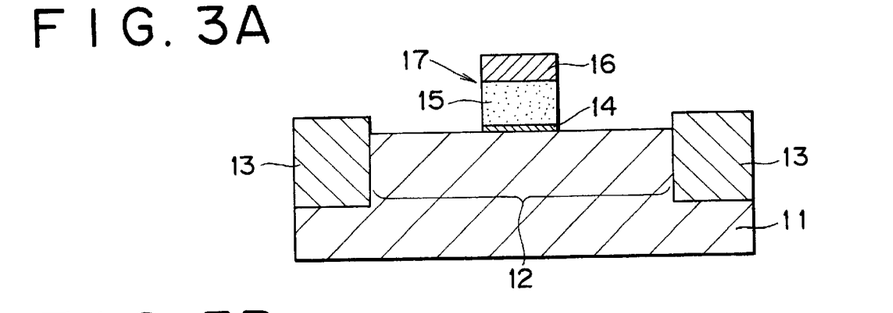
FIGS. 3A to 3N are process diagrams illustrating a second embodiment concerning a second fabrication method of the present invention.

As shown in FIG. 3A, isolation regions 13 for isolating an element forming region 12 from other regions are formed in a silicon substrate 11, followed by formation of, for example, a well in the silicon substrate 11 and implantation of ions of an impurity in the silicon substrate 11 for adjustment of a threshold voltage (Vth) or the like, and a gate insulating film 14 is formed on the silicon substrate 11, for example, to a thickness of about 5 nm by an oxide film forming process such as thermal oxidation. A polycrystalline silicon film 15 is then formed, for example, to a thickness of about 150 nm by a film forming process such as CVD and an insulating film 16 made from silicon nitride is formed thereon to a thickness of about 200 nm. Then, the insulating film 16 and polycrystalline silicon film 15 are patterned by lithography and anisotropic etching, to form a gate electrode 17.

Figure 3B:
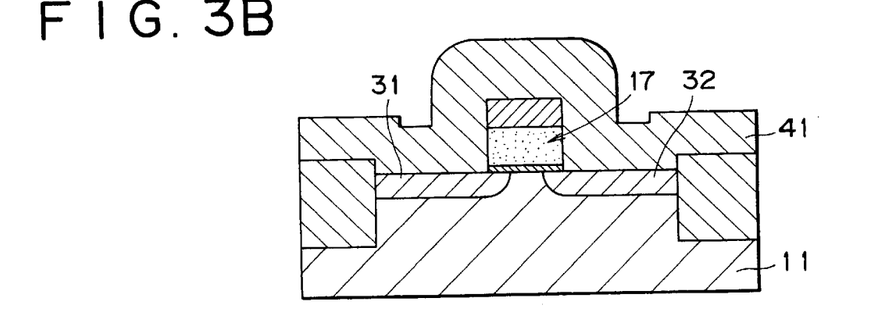

As shown in FIG. 3B, ions of an impurity are implanted in the silicon substrate 11 using the gate electrode 17 as a mask, to form extension electrodes 31 and 32 for source/drain electrodes. A silicon oxide film 41 is formed on the silicon substrate 11 to a thickness of about 150 nm in such a manner as to cover the gate electrode 17.

Figure 3C:
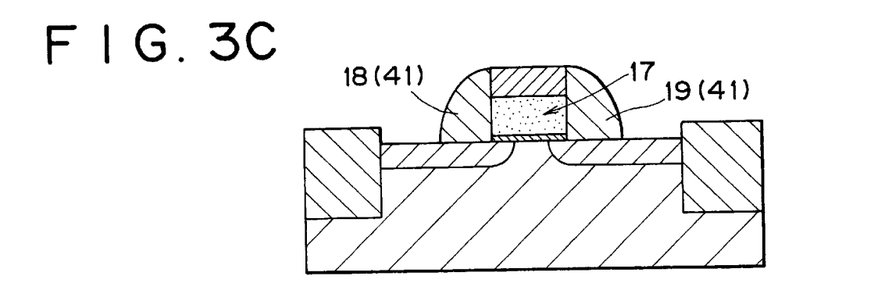

The silicon oxide film 41 is anisotropically etched in such a manner as to remain only on side walls of the gate electrode 17, to form side walls 18 and 19 as shown in FIG. 3C. The side walls 18 and 19, which have an etching selectivity to the insulating film 16, can be used as an etching mask at the following step for etching the insulating film 16.

Figure 3D:
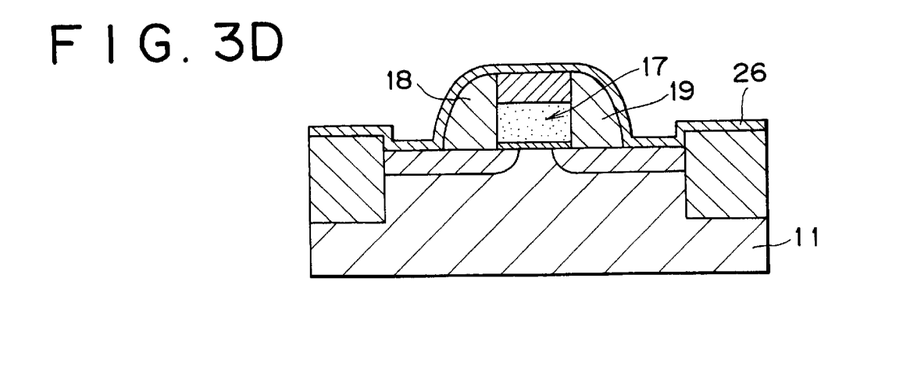
Figure 3E:
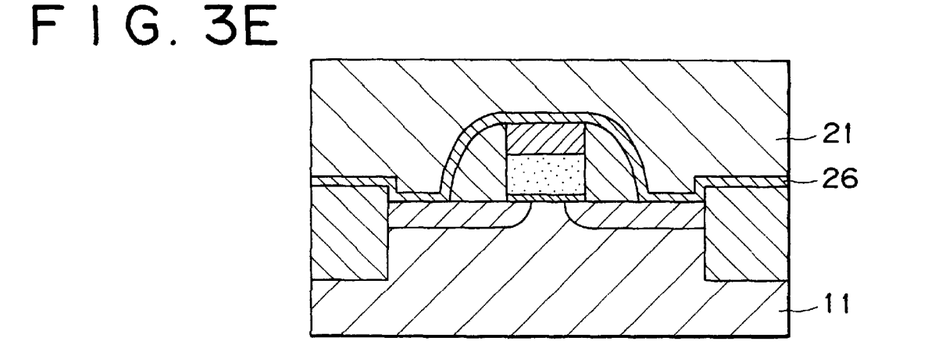
Figure 3F:
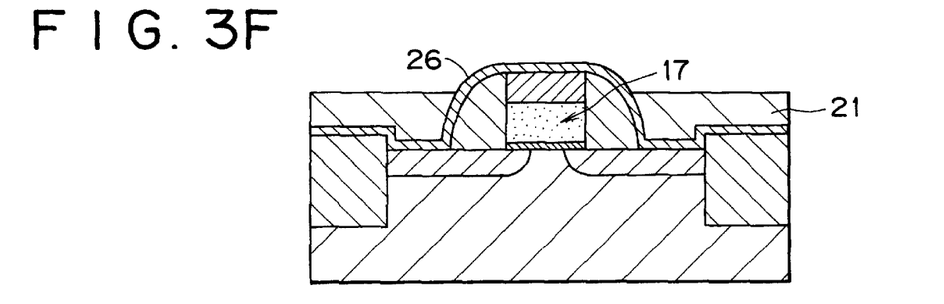

As shown in FIG. 3D, a mask layer forming film 26 made from phosphosilicate glass (PSG) is deposited by an atmospheric pressure CVD process on the silicon substrate 11 to a thickness of 30 nm in such a manner as to cover the gate electrode 17, side walls 18 and 19, and the like. As shown in FIG. 3E, a resist film 21 is formed by a coating process on the silicon substrate 11 to a thickness of about 400 nm in such a manner as to cover the above mask layer forming film 26. Then, the resist film 21 is removed a thickness of about 250 nm by anisotropic etching, to expose the mask layer forming film 26 on the gate electrode 17 from the resist film 21 as shown in FIG. 3F.

Figure 3G:
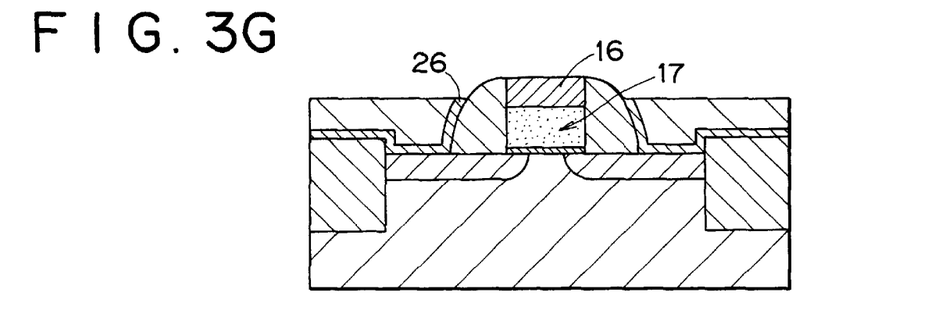
Figure 3H:
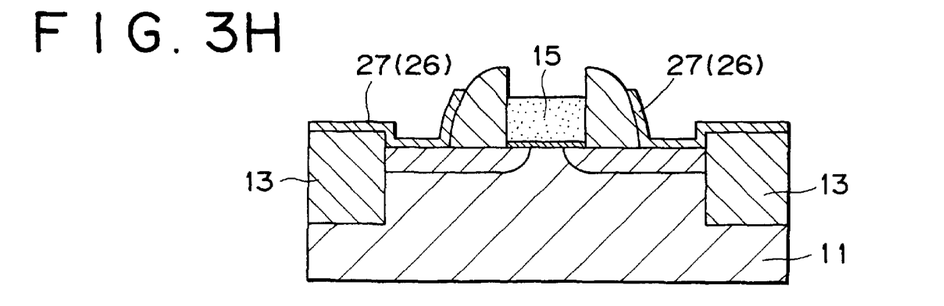

The mask layer forming film 26 on the gate electrode 17 is then removed by anisotropic etching, to expose the insulating film 16 and also form a mask layer 27 as shown in FIG. 3G. After removal of the resist film 21, the insulating film 16 is selectively removed by wet etching using hot phosphoric acid, to expose the polycrystalline silicon film 15 as shown in FIG. 3H. At this time, the silicon substrate 11 and the isolation insulating films 13, which are covered with the mask layer 27, are not etched.

Figure 3I:
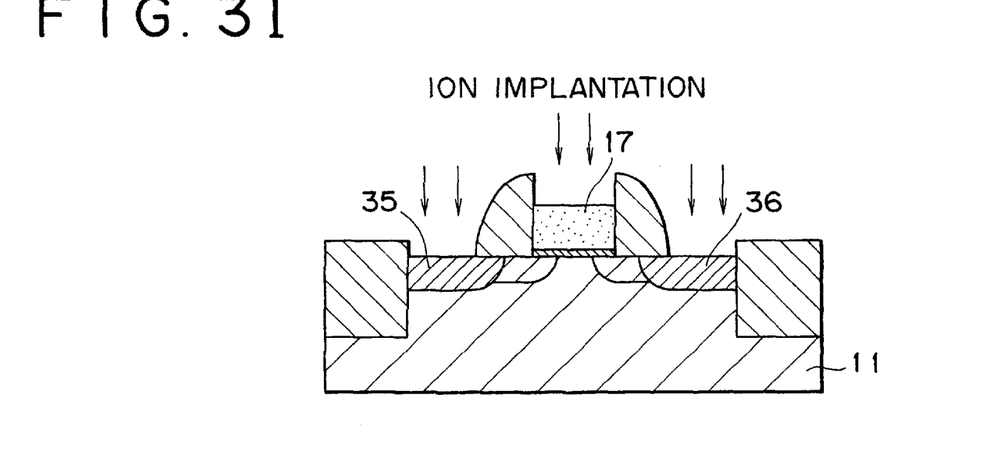

After removal of the mask layer 27, ions of an impurity are implanted by an ion-implantation process in the gate electrode 17 and in the silicon substrate 11 on both sides of the gate electrode 17 as shown in FIG. 3I, followed by RTA, for example, lamp annealing at 1000° C. for 10 seconds, to form source/drain electrodes 35 and 36 in the silicon substrate 11.

Figure 3J:
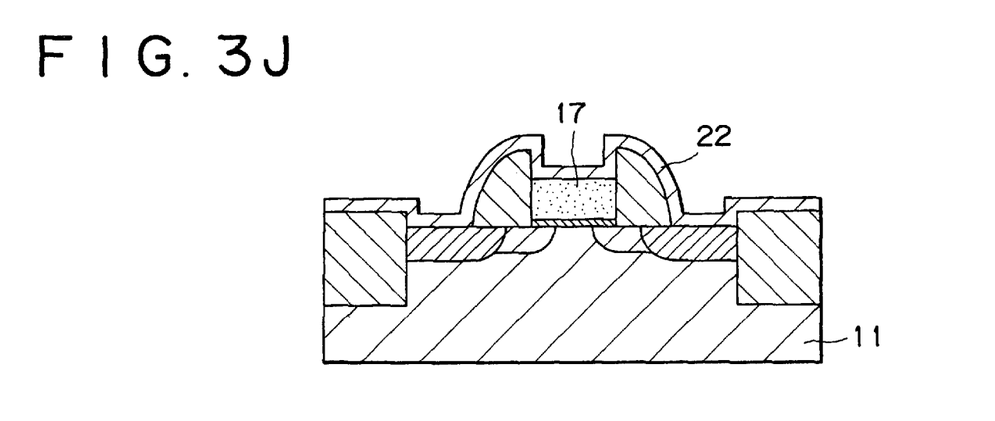

As shown in FIG. 3J, a refractory metal film 22 for forming a silicide, which is made from such as cobalt, is deposited to a thickness of 20 nm over the entire surface of the silicon substrate 11 on the gate electrode 17 side.

Figure 3K:
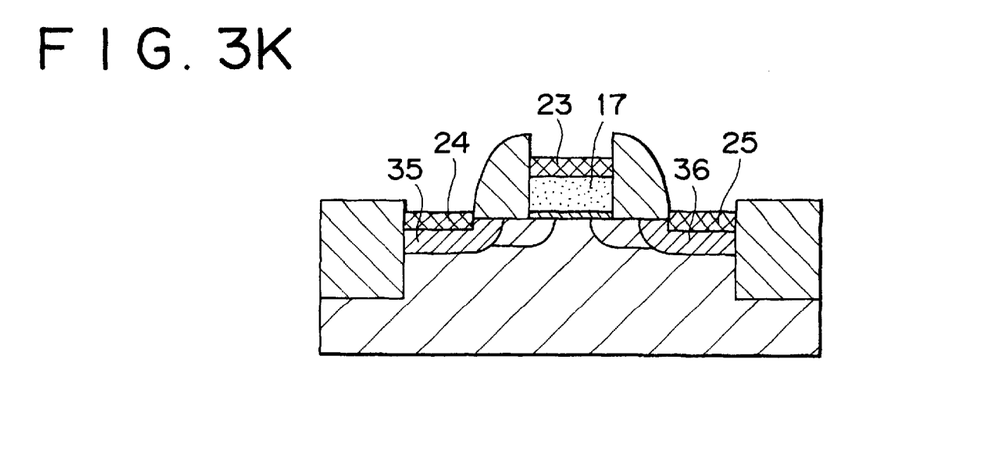

The refractory metal film 22 is then subjected to heat-treatment (for example, RTA) for silicidation of cobalt. Specifically, the heat-treatment is performed by lamp annealing at 550° C. for 30 seconds. The unreacted refractory metal film 22 is removed by wet etching using diluted sulfuric acid, with a result that only a cobalt silicide layer remains. Thus, as shown in FIG. 3K, a metal silicide layer 23 made from cobalt silicide is formed on the polycrystalline silicon film 15 of the gate electrode 17, and also metal silicide layers 24 and 25 made from cobalt silicide are respectively formed on the source/drain electrodes 35 and 36.

Figure 3L:
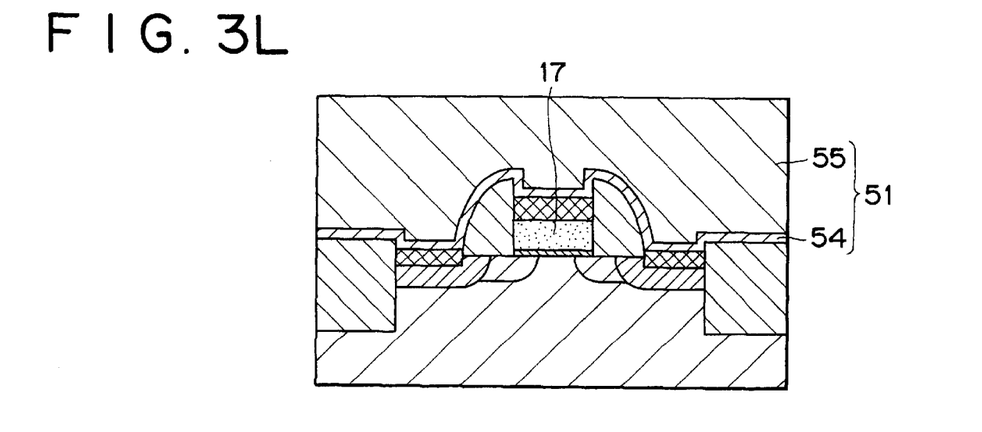
Figure 3M:
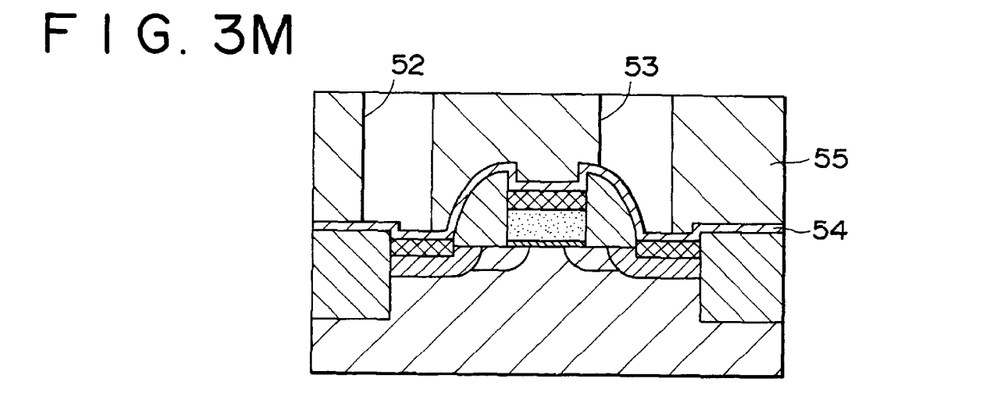

As shown in FIG. 3L, a silicon nitride film 54 is deposited on the silicon substrate 11 to a thickness of 70 nm in such a manner as to cover the gate electrode 17 and the like and then a silicon oxide film 55 is deposited thereon to a thickness of 70 nm in order to form an interlayer insulating film 51. Then, as shown in FIG. 3M, part of contact holes 52 and 53 are opened in the silicon oxide film 55 by lithography and etching. Here, each of the contact holes 52 and 53 is formed to a depth reaching to the silicon nitride film 54 by anisotropic etching under such a condition that an etching rate of the silicon oxide film 55 becomes 10 times that of the silicon nitride film 54.

Figure 3N:
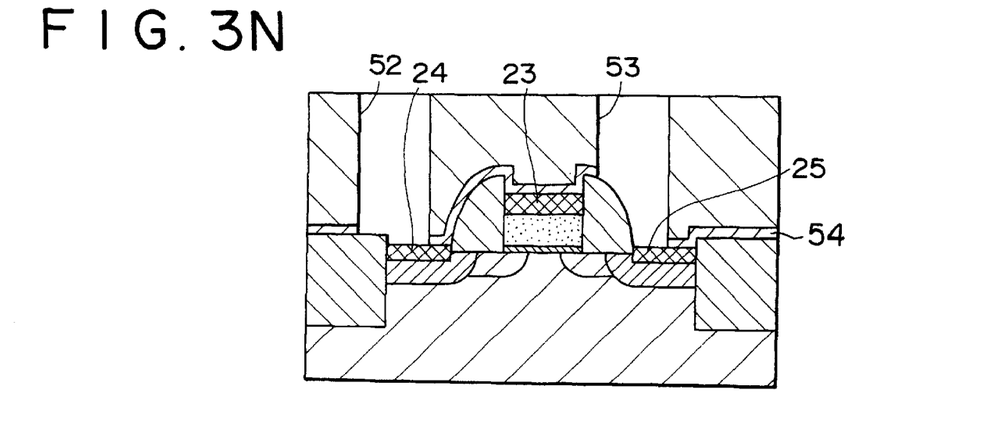

As shown in FIG. 3N, the silicon nitride film 54 is etched until the metal silicide layers 24 and 25 are exposed at such a condition that an etching rate of silicon nitride becomes 30 times that of cobalt silicide. In this way, the contact holes 52 and 53 are formed. While not shown, a contact hole is also formed directly over the metal silicide layer 23.

After that, while not shown, contact portions and interconnections are formed in accordance with the same procedure as that in the related art method.

In the fabrication method according to the second embodiment, a resist film (not shown) formed by lithography is removed after etching using the resist pattern as a mask.

In the second embodiment, as described in the first embodiment, silicon layers for forming source/drain electrodes may be formed on the silicon substrate 11.

In accordance with the fabrication method according to the second embodiment, a CMOS transistor is formed as follows: namely, extension electrodes 31 and 32 and source/drain electrodes 35 and 36 of a pMOS transistor are formed by doping a p-type impurity in a region where the PMOS transistor is to be formed, covering a region where an nMOS transistor is to be formed with a resist mask; and extension electrodes 31 and 32 and source/drain electrodes 35 and 36 of the nMOS transistor are formed by doping an n-type impurity in the region where the nMOS transistor is to be formed, covering the region where the pMoS transistor is to be formed with a resist mask.

According to the fabrication method of the second embodiment, even if a distance between the gate electrode 17 and each of the contact holes 52 and 53 in a plan view becomes zero, it is possible to ensure at least a distance nearly equal to a thickness of the silicon nitride film 54 between the gate electrode 17 and a contact material to be formed in each of the contact holes 52 and 53. As a result, it is possible to avoid short-circuits between the gate electrode 17 and each of the contact portions (not shown) formed in the contact holes 52 and 53 and to reduce a leak current.

That is to say, in the case of simultaneous silicidation of the gate electrode 17 as well as the source/drain electrodes 35 and 36 in combination with the self-aligned contact forming process, a distance between a contact material and a gate electrode 17 can be ensured; consequently, it is possible to enhance the performance of a semiconductor device due to a reduction in parasitic resistance and improve the degree of integration of the semiconductor device while preventing short-circuits between the gate electrode 17 and the contact portion and suppressing a leak current.

A third embodiment concerning the second fabrication method of the present invention will be described with reference to fabrication steps shown in FIGS. 4A to 4L. In these figures, parts corresponding to those shown in FIGS. 2A to 2I and FIGS. 3A to 3N are indicated by the same reference numerals.

Figure 4A:
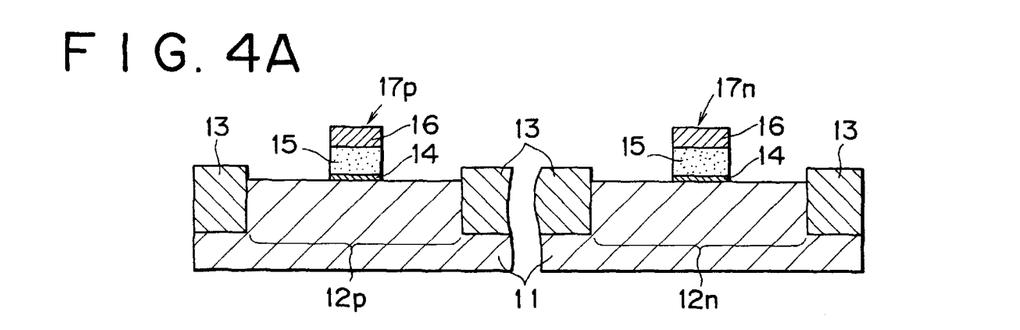
FIGS. 4A to 4L are process diagrams illustrating a third embodiment concerning the second fabrication method of the present invention.

As shown in FIG. 4A, isolation regions 13 for isolating a region 12p (hereinafter, referred to as "pMOS region") where elements of a pMOS transistor are to be formed from a region 12n (hereinafter, referred to as "nMOS region") where elements of an nMOS transistor are to be formed, are formed in a silicon substrate 11, followed by formation of, for example, a well in the silicon substrate 11 and implantation of ions of an impurity in the silicon substrate 11 for adjusting a threshold voltage (Vth) and the like, and a gate insulating film 14 is formed on the silicon substrate 11 to a thickness of 5 nm by an oxide film forming process such as thermal oxidation. A polycrystalline silicon film 15 is then formed to a thickness of about 150 nm by a film forming process such as CVD, and an insulating film 16 made from silicon nitride is formed thereon to a thickness of about 200 nm. Then, the insulating film 16 and the polycrystalline silicon film 15 are patterned by lithography and anisotropic etching, to form gate electrodes 17p and 17n in the PMOS region 12p and nMOS region 12n respectively.

Figure 4B:
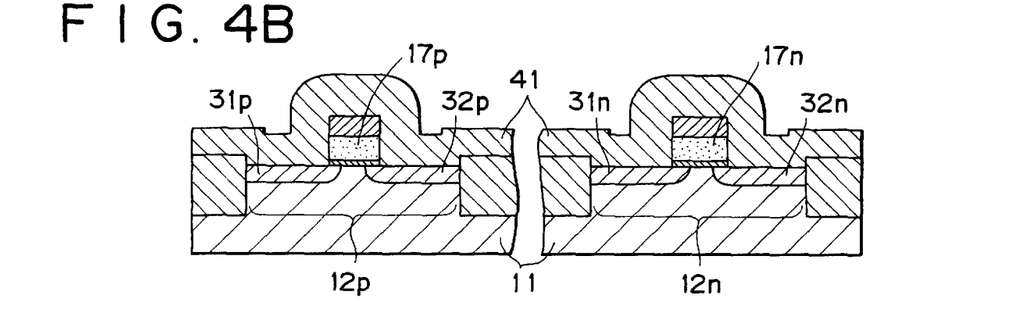

As shown in FIG. 4B, a resist film (not shown) is formed in such a manner as to cover the nMOS region 12n, and ions of a p-type impurity are implanted in the silicon substrate 11 using the resist film and the gate electrode 17p as a mask to form extension electrodes 31p and 32p for source/drain electrodes, followed by removal of the resist film. Then, a resist film (not shown) is formed in such a manner as to cover the pMOS region 12p, and ions of an n-type impurity are implanted in the silicon substrate 11 using the resist film and the gate electrode 17n as a mask to form extension electrodes 31n and 32n for source/drain electrodes. Before implantation of ions of the p-type impurity, a thin oxide film (not shown) may be formed on the surface of the silicon substrate 11, followed by removal of the thin oxide film after implantation of ions of the p-type impurity. A silicon oxide film 41 is formed on the silicon substrate 11 to a thickness of 150 nm in such a manner as to cover the gate electrodes 17p and 17n.

Figure 4C:
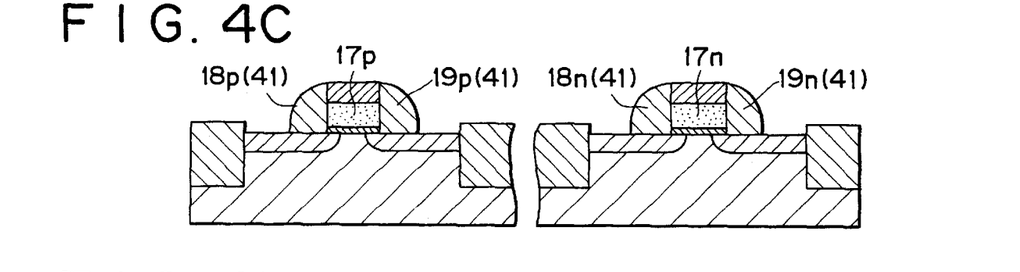

Then, as shown in FIG. 4C, the silicon oxide film 41 is anisotropically etched in such a manner as to remain on side walls of the gate electrode 17p to form side walls 18p and 19p, and to remain on side walls of the gate electrode 17n to form side walls 18n and 19n. The side walls 18p, 19p, 18n and 19n, which have an etching selectivity to the insulating film 16, can be used as an etching mask upon etching the insulating film 16.

Figure 4D:
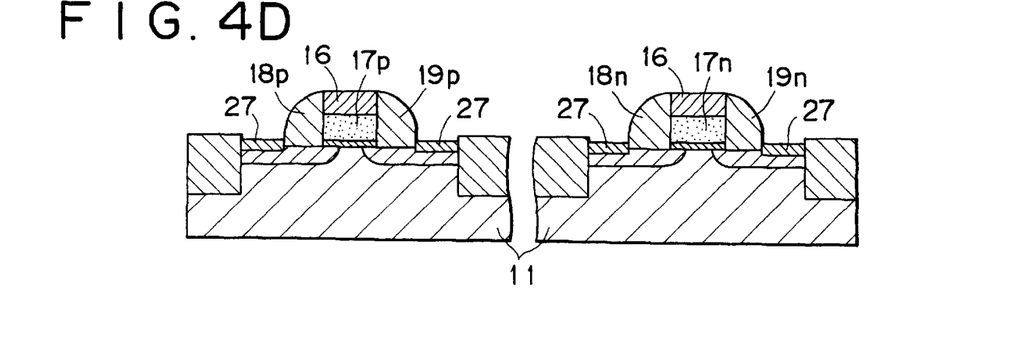

As shown in FIG. 4D, the exposed portion of the silicon substrate 11 is selectively oxidized to form a mask layer 27 having a thickness of about 5 nm.

Figure 4E:
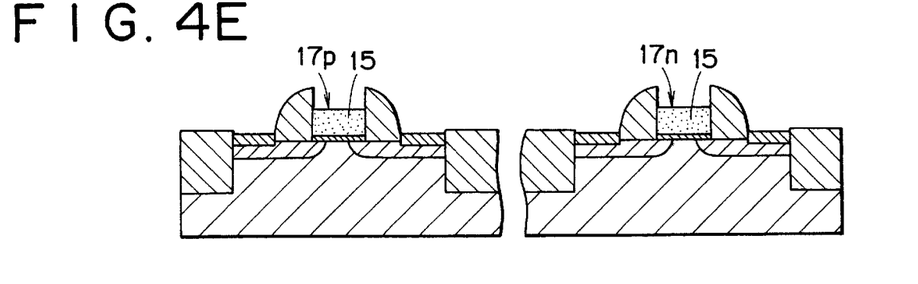

The insulating film 16, made from silicon nitride, on each of the gate electrodes 17p and 17n is selectively removed by wet etching using hot phosphoric acid. At this time, the silicon substrate 11, which is covered with the mask layer 27 made from silicon oxide, the side walls 18p, 19p, 18n and 19n, and the like, is not etched. As a result, as shown in FIG. 4E, the polycrystalline silicon film 15 of each of the gate electrodes 17p and 17n is exposed.

Figure 4F:
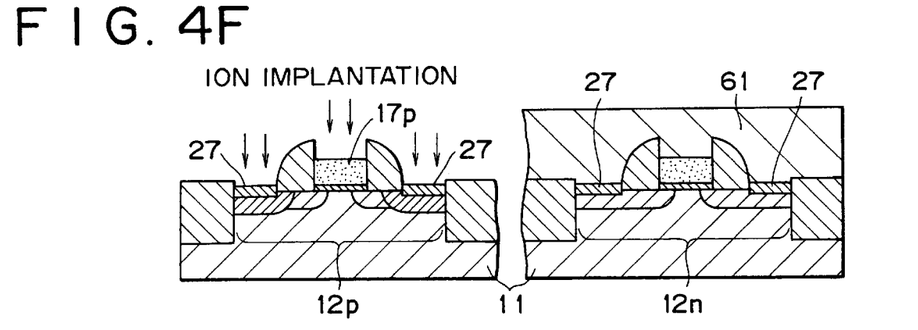

As shown in FIG. 4F, a resist film 61 is formed in such a manner as to cover the riMOS region 12n by lithography, and ions of a p-type impurity, for example, ions of boron difluoride (BF$_2$+) are implanted in the silicon substrate 11 and the gate electrode 17p in the pMOS region 12p. In this case, the implantation energy is set at 30 kev, and the dose is set at 5×10$^{15}$ ions/cm$^2$.

Figure 4G:
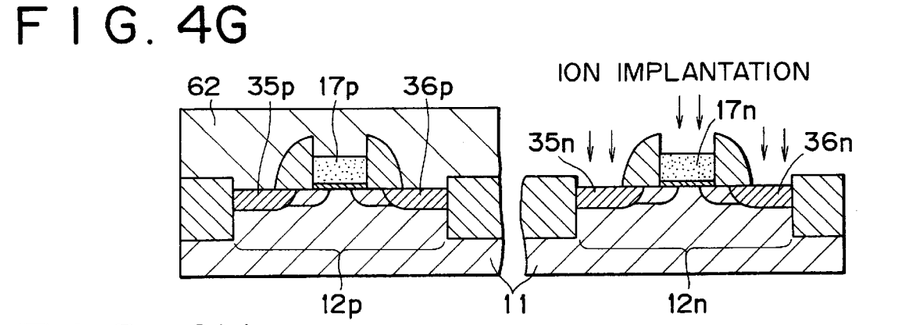

After removal of the resist film 61, the mask layer 27 is removed by wet etching using a diluted solution of hydrofluoric acid. Then, as shown in FIG. 4G, a resist film 62 is formed in such as manner as to cover the pMOS region 12p by lithography, and ions of an n-type impurity, for example, ions of arsenic (As+) are implanted in the silicon substrate 11 and the gate electrode 17n in the nMOS region 12n. In this case, the implantation energy is set at 60 keV, and the dose of 5×10$^{15}$ ions/cm$^2$.

After the resist film 62 is removed, followed by RTA, for example, lamp annealing at 1000° C. for 10 sec, to activate the gate electrode 17p and source/drain electrodes 35p and 36p in the pMOS region of the silicon substrate 11 and the gate electrode 17n and source/drain regions 35n and 36n in the nMOS region of the silicon substrate 11.

Figure 4H:
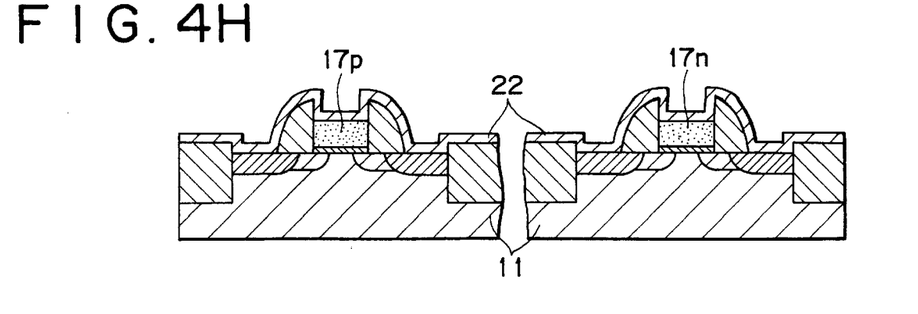

Then, as shown in FIG. 4H, a refractory metal film 22 for forming a silicide, which is made from such as cobalt, is deposited to a thickness of 20 nm over the entire surface of the silicon substrate 11 on the gate electrodes 17p and 17n sides.

Figure 4I:
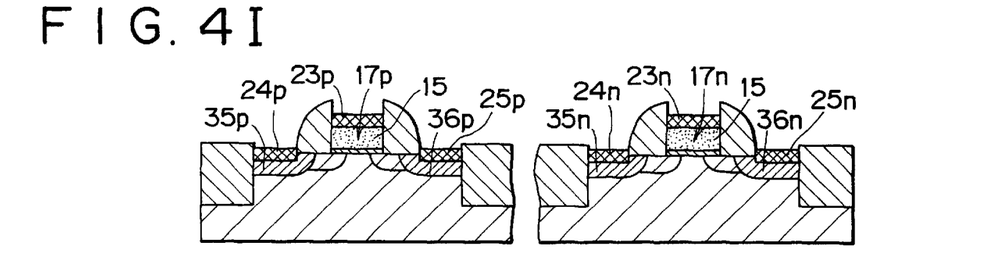

The refractory metal film 22 is then subjected to heat-treatment (for example, RTA) for silicidation of cobalt. Specifically, the heat-treatment is performed by lamp annealing at 550° C. for 30 sec. Then, the unreacted refractory metal film 22 is removed by wet etching using diluted sulfuric acid, with a result that only a cobalt silicide layer remains. Thus, as shown in FIG. 4I, a metal silicide layer 23p made from cobalt silicide is formed on the polycrystalline silicon film 15 of the gate electrode 17p; metal silicide layers 24p and 25p made from cobalt silicide are respectively formed on the source/drain electrodes 35p and 36p; a metal silicide layer 23n made from cobalt silicide layer is formed on the polycrystalline silicon film 15 of the gate electrode 17n; and metal silicide layers 24n and 25n made from cobalt silicide layer are respectively formed on the source/drain electrodes 35n and 36n.

Figure 4J:
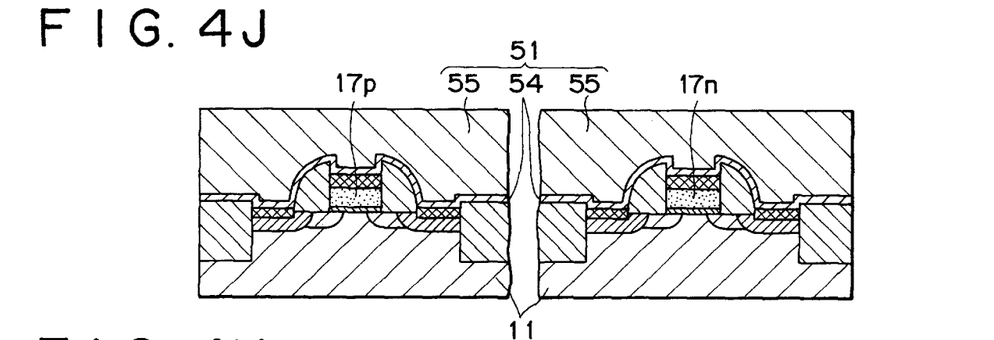
Figure 4K:
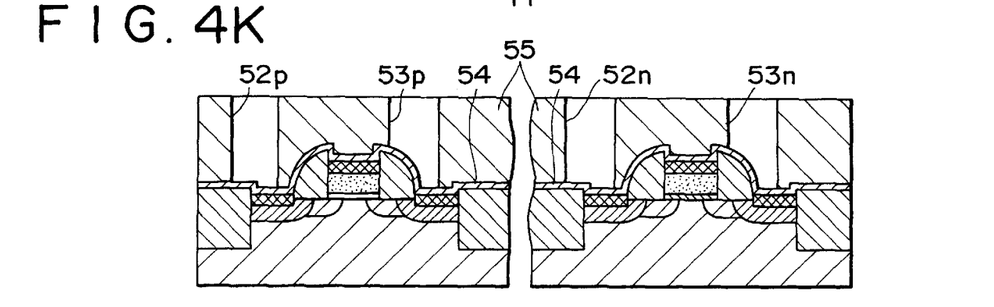

As shown in FIG. 4J, a silicon nitride film 54 is deposited on the silicon substrate 11 to a thickness of 70 nm in such a manner as to cover the gate electrodes 17p and 17n and the like and then a silicon oxide film 55 is deposited thereon to a thickness of 70 nm in order to form an interlayer insulating film 51. After that, as shown in FIG. 4K, part of contact holes 52p and 53p and part of contact holes 52n and 53n are formed in the silicon oxide film 55 by lithography and etching. Here, the contact holes 52p, 53p, 52n and 53n are formed to a depth reaching to the silicon nitride film 54 by anisotropic etching in such a condition that an etching rate of the silicon oxide film 55 becomes 10 times that of the silicon nitride film 54.

Figure 4L:
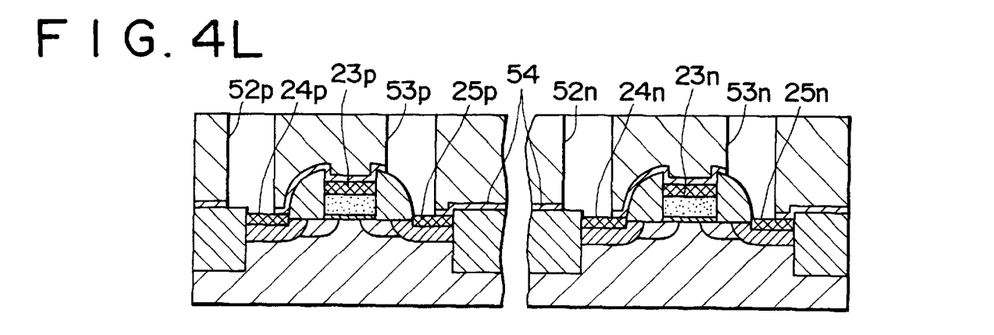

As shown in FIG. 4L, the silicon nitride film 54 is etched until the metal silicide layers 24p, 25p, 24n and 25n are exposed in such a condition that an etching rate of silicon nitride becomes 30 times that of cobalt silicide. In this way, the contact holes 52p, 53p, 52n and 53n are formed. While not shown, contact holes are formed directly over the metal silicide layers 23p and 23n.

After that, while not shown, contact portions and interconnections are formed in accordance with the same procedure as that in the related art method.

In the fabrication method according to the third embodiment, a resist film (not shown) formed by lithography is removed after etching using the resist pattern as a mask.

According to the third embodiment, as described in the first embodiment, a silicon layer for forming source/drain electrodes may be formed on the silicon substrate 11.

While the preferred embodiments of the present invention have been described using specific terms, such description is for illustrative purposes only, and it is to be understood that changes and variations may be made without departing the spirit or scope of the following claims.

What is claimed is:

1. A method of fabricating a semiconductor device, comprising the steps of:

preparing a silicon substrate on which a gate insulating film is formed and a gate electrode composed of a multi-layer film of a polycrystalline silicon film and an insulating film is formed on said gate insulating film;

forming side walls from a material having an etching selectivity to said insulating film on both sides of said gate electrode;

forming a resist film on said silicon substrate in such a manner as to cover said gate electrode, and etching-back said resist film until said resist film remains on said silicon substrate except for said gate electrode portion to expose an upper portion of said gate electrode;

selectively removing said insulating film on said gate electrode using said resist film and said side walls as a mask, and removing said resist film; and forming a refractory metal film on said silicon substrate in such a manner as to cover said gate electrode, and forming metal silicide films on said gate electrode and said silicon substrate by silicidizing, through heat-treatment, said refractory metal film with said polycrystalline silicon film of said gate electrode and with said silicon substrate.

2. A method of fabricating a semiconductor device according to claim 1, wherein said insulating film is made from silicon oxide, and said side walls are made from silicon nitride.

3. A method of fabricating a semiconductor device, comprising the steps of:

preparing a silicon substrate on which a gate insulating film is formed and a gate electrode composed of a multi-layer film of a polycrystalline silicon film and an insulating film is formed on said gate insulating film;

forming side walls from a material having an etching selectivity to said insulating film on both sides of said gate electrode;

forming a mask layer from a material having an etching selectivity to said insulating film on said silicon substrate in such a manner as to cover said silicon substrate;

selectively removing said insulating film on an upper portion of said gate electrode using said mask layer and said side walls as a mask, and removing said mask layer; and forming a refractory metal layer on said silicon substrate in such a manner as to cover said gate electrode, and forming metal silicide films on said gate electrode and said silicon substrate by silicidizing, through heat-treatment, said refractory metal film with said polycrystalline silicon film of said gate electrode and with said silicon substrate.

4. A method of fabricating a semiconductor device according to claim 3, wherein said mask layer is formed by the steps of:

forming a mask layer forming film on said silicon substrate in such a manner as to cover said gate electrode, and forming a resist film on said mask layer forming film;

etching-back said resist film in such a manner that said mask layer forming film on said gate electrode is exposed, and removing said mask layer forming film on said gate electrode using said resist film as a mask; and removing said resist film.

5. A method of fabricating a semiconductor device according to claim 3, wherein said insulating film is made from silicon nitride, and said mask layer is made from silicon oxide.

6. A method of fabricating a semiconductor device according to claim 4, wherein said insulating film is made from silicon nitride, and said mask layer is made from silicon oxide.

7. A method of fabricating a semiconductor device according to claim 3, wherein said mask layer is formed by selectively oxidizing said silicon substrate.

8. A method of fabricating a semiconductor device according to claim 7, wherein said insulating film is made from silicon nitride.

9. A method of fabricating a semiconductor device according to claim 3, further comprising the steps of:

forming said metal silicide layer; and forming a first interlayer insulating film on said silicon substrate, and forming a second interlayer insulating film from a material having an etching selectivity to said first interlayer insulating film on said first interlayer insulating film.

10. A method of fabricating a semiconductor device according to claim 9, wherein said side walls are made from a silicon oxide based material; said first interlayer insulating film is made from silicon nitride; and said second interlayer insulating film is made from a silicon oxide based material.

* * * * *